(12) United States Patent
Liu et al.

(10) Patent No.: US 8,017,480 B2
(45) Date of Patent: Sep. 13, 2011

(54) APPARATUS AND ASSOCIATED METHOD FOR MAKING A FLOATING GATE CELL IN A VIRTUAL GROUND ARRAY

(75) Inventors: Chen-Chin Liu, Hsinchu (TW); Chun-Pei Wu, Nantou (TW); Ta-Kang Chu, Kaohsiung (TW); Yao-Fu Chan, Changhua (TW)

(73) Assignee: Macronix International Co., Ltd. (TW)

( * ) Notice: Subject to any disclaimer, the term of this patent is extended or adjusted under 35 U.S.C. 154(b) by 327 days.

(21) Appl. No.: 11/423,842

(22) Filed: Jun. 13, 2006

(65) Prior Publication Data

US 2007/0284644 A1 Dec. 13, 2007

(51) Int. Cl.
*H01L 21/8234* (2006.01)
(52) U.S. Cl. . 438/261; 438/298; 438/593; 257/E21.681; 257/E21.68
(58) Field of Classification Search ........... 257/E21.681, 257/E21.68; 438/266, 261–262, 298
See application file for complete search history.

(56) References Cited

U.S. PATENT DOCUMENTS

| 4,451,904 | A | * | 5/1984 | Sugiura et al. | 365/185.16 |
|---|---|---|---|---|---|
| 5,162,244 | A | * | 11/1992 | Lim | 438/366 |
| 5,229,631 | A | * | 7/1993 | Woo | 257/314 |
| 5,354,716 | A | * | 10/1994 | Pors et al. | 438/396 |
| 5,475,250 | A | * | 12/1995 | Bellezza | 257/316 |
| 5,556,798 | A | * | 9/1996 | Hong | 438/257 |
| 5,837,584 | A | * | 11/1998 | Lu et al. | 438/263 |
| 5,841,163 | A | * | 11/1998 | Joo et al. | 257/316 |
| 6,797,567 | B2 | * | 9/2004 | Chang | 438/266 |
| 2004/0252576 | A1 | * | 12/2004 | Hofmann et al. | 365/232 |

* cited by examiner

*Primary Examiner* — A. Sefer
*Assistant Examiner* — Allen L Parker
(74) *Attorney, Agent, or Firm* — Baker & McKenzie LLP

(57) ABSTRACT

A method for fabricating a floating gate memory device comprises using thin buried diffusion regions with increased encroachment by a buried diffusion oxide layer into the buried diffusion layer and underneath the tunnel oxide under the floating gate. Further, the floating gate polysilicon layer has a larger height than the buried diffusion height. The increased step height of the gate polysilicon layer to the buried diffusion layer, and the increased encroachment of the buried diffusion oxide, can produce a higher GCR, while still allowing decreased cell size using a virtual ground array design.

8 Claims, 6 Drawing Sheets

APPARATUS AND ASSOCIATED METHOD FOR MAKING A FLOATING GATE CELL IN A VIRTUAL GROUND ARRAY

BACKGROUND

1. Field of the Invention

The embodiments described herein are directed to methods for fabricating non-volatile memory devices, and more particularly to methods for fabricating floating-gate memory devices using virtual ground arrays.

2. Background of the Invention

FIG. 1 is a schematic representation of a conventional floating gate memory cell 100. Memory cell 100 comprises a substrate 101 with diffusion regions 103 and 105 formed therein. The diffusion regions correspond to the source and drain of FET-type device. According to one example, substrate 101 can be a P-type substrate and diffusion regions 103 and 105 can be N-type diffusion regions. In other embodiments, cell 100 can comprise an N-type substrate 101 with P-type diffusion regions 103 and 105. Although it will be understood that a P-type substrate is generally preferred.

Cell 100 further comprises a gate dielectric layer, sometimes referred to as a tunnel dielectric layer 107 formed over substrate 101 between diffusion regions 103 and 105. A floating gate 109 is then formed over gate dielectric 107. Floating gate 109 is typically formed from a polysilicon. An inter polysilicon (poly) dielectric layer 111 then separates floating gate 109 from a control gate 113. Control gate 113 is also typically formed from polysilicon. Inter-poly dielectric layer 111 can be formed from, e.g., a silicon dioxide ($SiO_2$) material. In other embodiments, inter-poly dielectric 111 can comprise a multi-layer structure such as a Oxide-Nitride-Oxide (ONO) structure.

In operation, a high voltage is applied to control gate 113 in order to program cell 100. This voltage is coupled with floating gate 109 via a control gate capacitance ($C_{CG}$). The coupled voltage causes an inversion channel to be formed in the upper layer of substrate 101 between diffusion regions 103 and 105. Voltages are then applied to diffusion regions 103 and 105 so as to create a large lateral electric field that will cause carriers to flow through the channel, e.g., from one diffusion region towards the other.

The voltage coupled with floating gate 109 will create an electric field sufficient to cause some of the carriers to tunnel through gate dielectric 107 into floating gate 109. In other words, the voltage coupled with floating gate 109 needs to be capable of producing an electric field that can supply the carriers with enough energy to allow them to overcome the barrier height of gate dielectric 107. Accordingly, as mentioned above, sufficient coupling between control gate 113 and floating gate 109 is required in order to ensure that an adequate field is present to induce carriers to pass through gate dielectric 107 onto floating gate 109.

It is well known to use virtual ground array designs in order to reduce the cell size for floating gate memory cells and non-volatile memory products, such as flash memory products. Smaller cell sizes, however, often require smaller buried diffusion sizes, which are not necessarily compatible with conventional processing techniques.

For example, one problem that can occur as a result of the reduced buried diffusion sizes with conventional fabrication techniques is a reduced gate coupling ratio (GCR) between the control gate and floating gate. Sufficient coupling is needed in order to ensure that an adequate field is present in the memory cell to induce carriers to pass through the tunnel oxide layer into the floating gate.

As is understood, the GCR is a function of the $C_{GC}$ as well as the Source Capacitance ($C_S$) Bulk Capacitance ($C_B$), and Drain Capacitance ($C_D$) illustrated in FIG. 1. The relationship is defined as:

$$GCR = C_{CG}/(C_S + C_B + C_D + C_{CG})$$

Accordingly, the GCR can be increased by increasing $C_{CG}$, or by decreasing the Source Capacitance ($C_S$) or Drain Capacitance ($C_D$). Thus, by increasing the distance between the floating gate 106 and the buried diffusion regions 116. source and drain capacitances ($C_S$, $C_D$) can be decreased. As a result, the gate coupling ratio (GCR) of the memory device can be improved. Accordingly, it is important to maintain adequate GCR in virtual ground arrays, despite the smaller buried diffusion sizes.

SUMMARY

A method for fabricating a floating gate memory device comprises using thin buried diffusion regions with increased encroachment by the buried diffusion oxide into the diffusion region and under the floating gate. This increased encroachment under the floating gate increases the step height between the floating gate and the buried diffusion region. The increased step height can produce a higher GCR, while still allowing decreased cell size using a virtual ground array design.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

In the methods described below, an increased GCR in a scaled virtual ground cell is provided by fabricating the cell in order to produce a large step height between the floating gate and the buried diffusion oxide. A dielectric layer formed over the floating gate is patterned to define a buried diffusion oxide region in which the buried diffusion oxide is formed. The buried diffusion oxide is then formed such that the buried diffusion oxide encroaches into the diffusion region and extends under an edge of the floating gate. As a result, a larger overlay region can be maintained between the control gate and floating gate, which increases the GCR.

Figure 1:
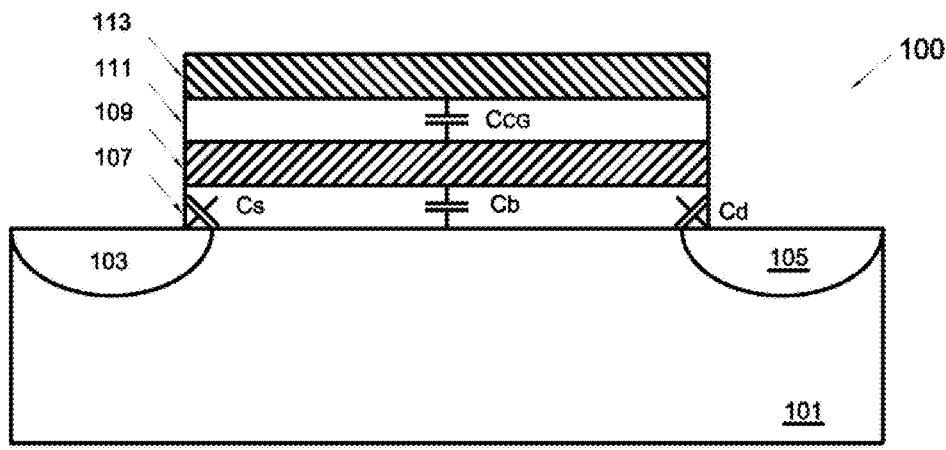
FIG. 1 is a schematic diagram illustrating a cross-sectional view of a conventional floating gate memory cell.
Figure 1A:
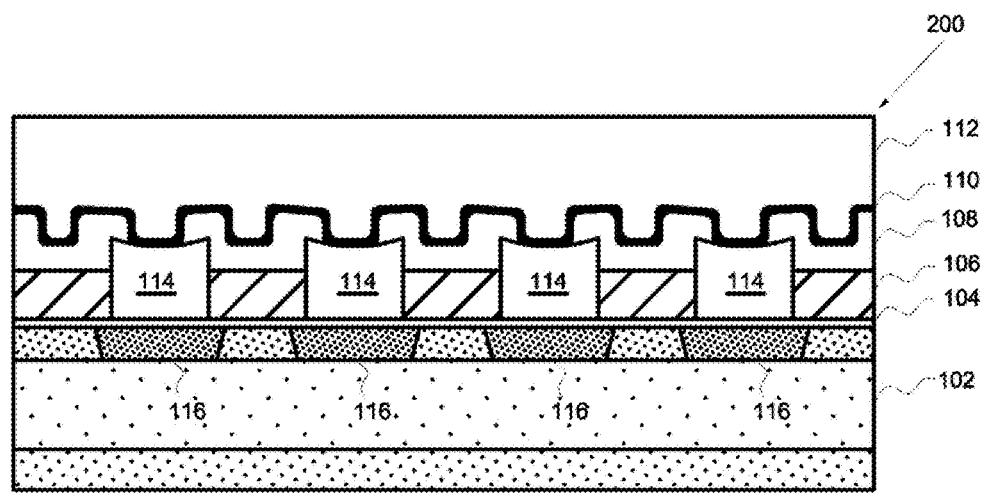
FIG. 1A is a schematic diagram illustrating a cross-sectional view of a floating gate memory device fabricated using a conventional fabrication process.

FIG. 1A is a schematic diagram illustrating a cross-sectional view of a conventional floating gate memory device fabricated using a conventional process. As can be seen, device 200 comprises a substrate 102 with diffusion regions 116 implanted therein. A dielectric layer 104 (i.e., a tunnel oxide layer) is formed on substrate 102. Floating gates for the various cells in device 100 are then formed from polysilicon layers 106 and 108. These layers can be referred to as the first and fourth poly layers respectively. Buried diffusion oxides 114 are formed over diffusion region 116 and Oxide-Nitride-Oxide (ONO) layer 110, i.e., inter-poly dielectric, is then formed over fourth poly layer 108. It will be understood that buried diffusion oxides 114 correspond with buried diffusion lines that run through the array.

Figure 2:
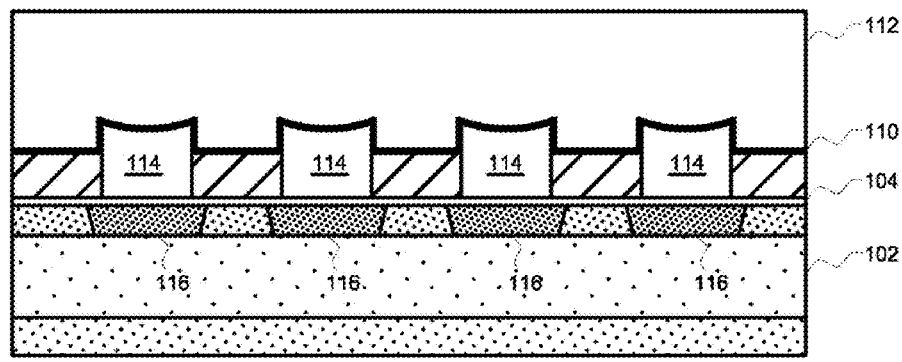
FIG. 2 is a schematic diagram illustrating a cross-sectional view of a floating gate memory device fabricated using a conventional fabrication process that does not include a fourth poly step.

A control gate polysilicon layer 112, i.e., the second poly layer, is then formed on ONO layer 110. As mentioned, as buried diffusion regions decrease in size, the coupling between control gate and the floating gate is reduced. This can make fabrication of scaled virtual ground cells incompatible with processes that include fourth poly layer 108. FIG. 2 is a diagram illustrating a floating gate memory device constructed using a conventional process that does not include the fourth poly layer 108; however, it can be shown that simply eliminating fourth poly layer 108 is not sufficient to provide adequate GCR to make an effective memory device.

Figure 3:
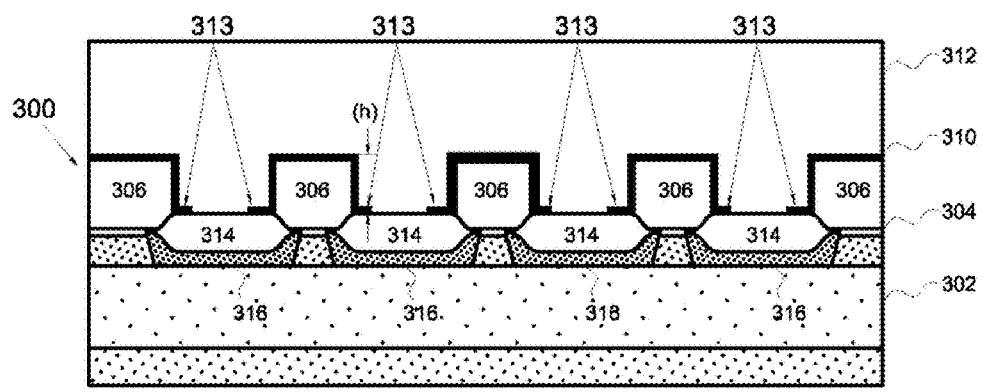
FIG. 3 is a schematic diagram illustrating a cross-sectional view of a floating gate memory cell fabricated in accordance with one embodiment.

Accordingly, FIG. 3 is a diagram illustrating a floating gate memory device 300 fabricated in accordance with the embodiments described herein. As can be seen, device 300 comprises thin buried diffusion oxides 314 that have an increased encroachment into the diffusion regions 316 and under the first dielectric layer 304, i.e., the tunnel oxide layer. Further, the step height (h) between the top of ONO layer 310 and the top of the buried diffusion oxide 314 is larger than in FIGS. 1A and 2. In FIG. 3, polysilicon layer 312, i.e., the second poly layer, overlays ONO layer 310, i.e., inter-poly dielectric, which is formed on top of floating gates 306. As can be seen, ONO layer 310 is not continuous between cells, but does slightly overlap buried diffusion oxides 314 at areas 313.

As can also be seen, the buried diffusion oxides 314 are formed so as to encroach into the buried diffusion region 316. Additionally, the buried diffusion oxide layer 314 is also formed so as to extend under the edges of the first dielectric layer 304 under the floating gate 306. The step height (h) between the top of ONO layer 310 and the top of buried diffusion oxide 314 is also clearly depicted. The increased step height (h) combined with the extension of buried diffusion oxides 314 under floating gates 306 produces a greater GCR.

It should be noted that while an ONO layer 310 is illustrated in the example of FIG. 3, layer 310 can be seen as simply a dielectric layer. Accordingly, the example of FIG. 3 should not be seen as limiting the devices and methods described herein to the use of a particular type of dielectric layer, e.g., an ONO layer 310, and it will be understood that any suitable dielectric layer can be used.

FIGS. 4A-4E are diagrams illustrating an exemplary process for fabricating a device 300 in accordance with one embodiment. First, in FIG. 4A, a dielectric layer 401, i.e., tunnel oxide, is formed on substrate 402. For example, dielectric layer 401 may comprise silicon dioxide ($SiO_2$). After this, a first poly layer 404 is deposited. The first poly layer 404 can be anywhere from approximately 1000 Å to 2000 Å.

Figure 4A:
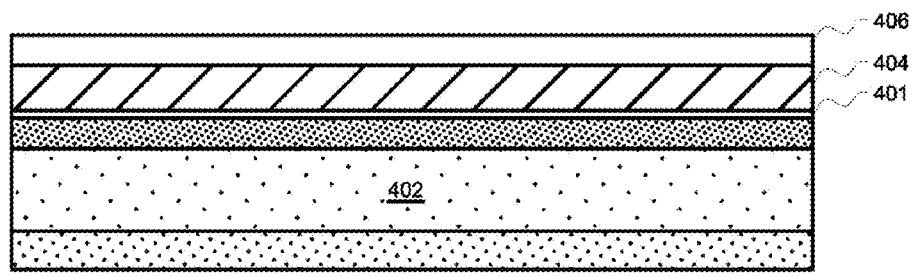
FIGS. 4A-4F are schematic diagrams illustrating an exemplary process for fabricating the floating gate memory device of FIG. 3 in accordance with one embodiment.
Figure 4B:
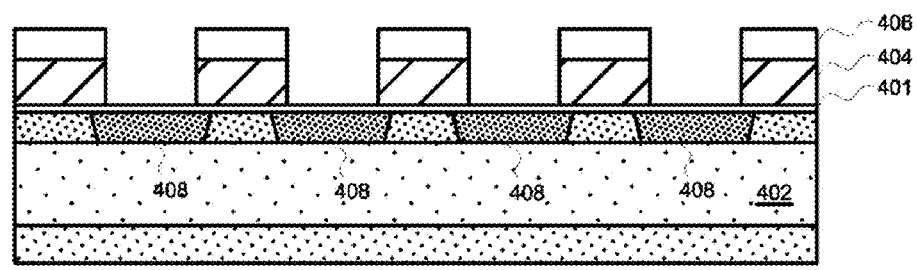

A silicon nitride layer 406 can then be deposited on first poly layer 404. A photoresist (not shown) can then be used to pattern first poly layer 404 and silicon nitride layer 406. Patterned layers 404 and 406 can then be etched as illustrated in FIG. 4B. Diffusion regions 408 can then be implanted and heat driven in substrate 402. For example, if substrate 402 is a P-type substrate, then N+ diffusion regions 408 can be implanted in the P-type substrate 402. Since the silicon nitride layer 406 and the first poly layer 404 act as an implant mask, this process is self-aligned.

Figure 4C:
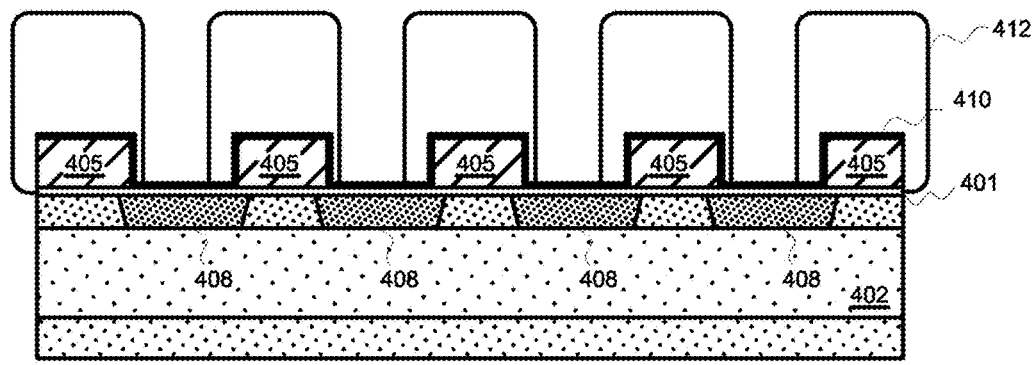

As illustrated in FIG. 4C, silicon nitride layer 406 can then be removed and ONO layer 410 can be deposited over gate polysilicon regions 405. Polysilicon regions 405 form the floating gates for each cell. ONO layer 410 can then be patterned using photoresist layer 412. Patterned ONO layer 410 can then be etched in order to define the areas for buried diffusion oxide formation.

Figure 4D:
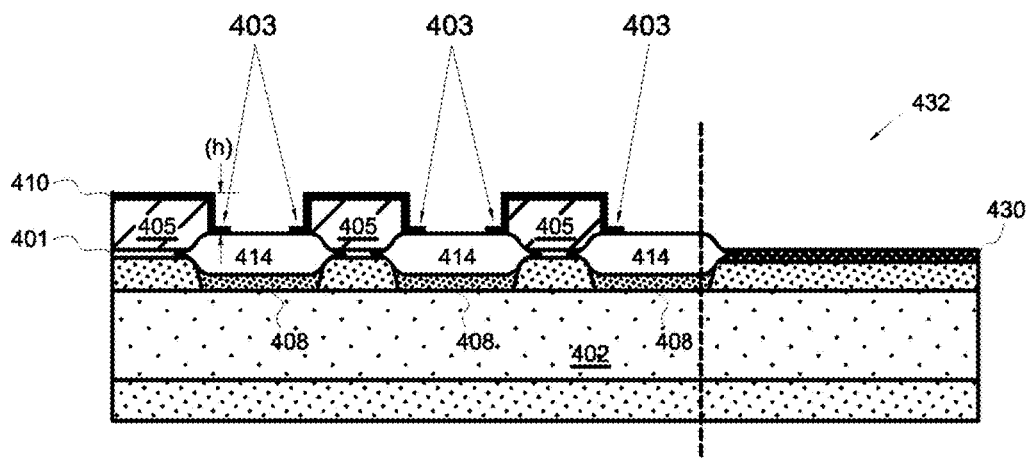

As illustrated in FIG. 4D, a dielectric layer 430 is also formed in a peripheral area 432. i.e., an area in which devices peripheral to the memory array such as array driver circuits are formed. This peripheral dielectric layer 430 can be formed of an ONO-type material and can be patterned using a peri-ONO photoresist (not shown). This dielectric layer can be formed in peripheral area 432 using a thermal process. In certain embodiments, buried diffusion oxides 414 can also be formed during the thermal process used to form the peripheral dielectric layer 430.

As shown in FIG. 4D, the thermal oxidation process can produce buried diffusion oxides 414 with thicknesses that are greater than approximately 200 Å, but still thinner than conventional buried diffusion oxides. Buried diffusion oxides 414 can be formed so as to encroach into diffusion regions 408. As can be seen ONO layer 410 overlaps diffusion oxide 414 at areas 403, which can produce the bird's beak formation seen at the edge of buried diffusion oxides 414. This bird's beak formation may also partially extend under the floating gate 405.

The overlap of floating gates 405 with respect to the buried diffusion oxides 414 can increase the GCR, which can increase the breakdown voltage between floating gates 405 and substrate 402. For example, in certain embodiments, a gate-to-substrate breakdown voltage of as high as approximately 15 volts can be achieved.

Additionally, the process described produces an increased step height (h) between the top of ONO layer 410 and the top of buried diffusion oxide 414. As mentioned, the increased step height (h) also contributes to a higher GCR. In certain embodiments, step heights in the range of approximately 300 Å to 800 Å can be achieved.

Figure 4E:
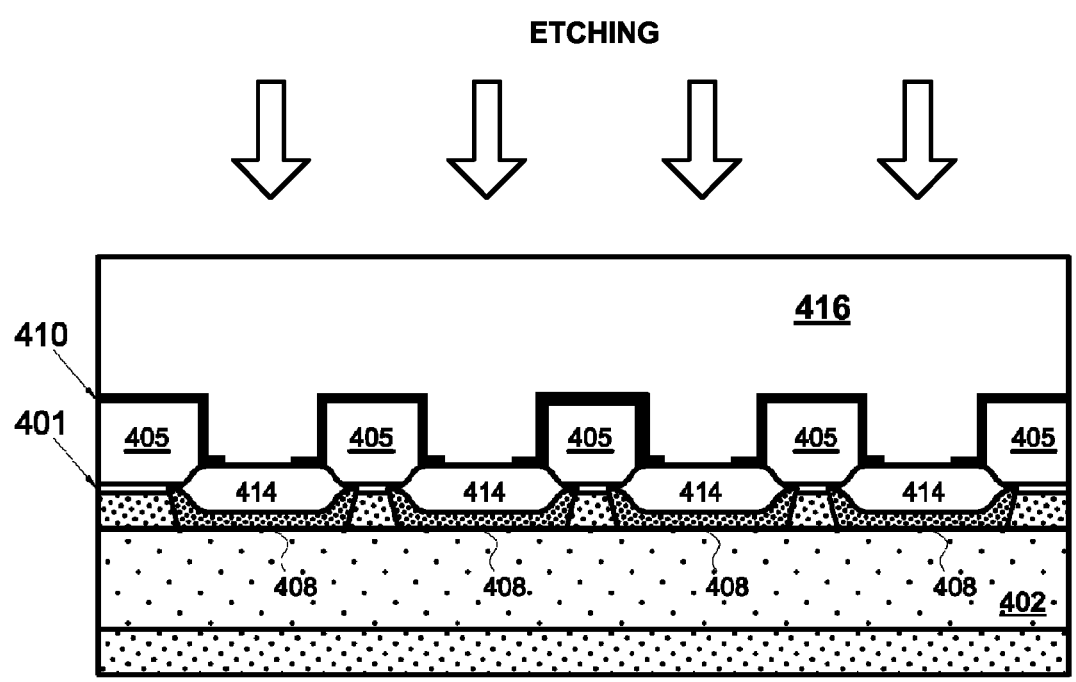
Figure 4F:
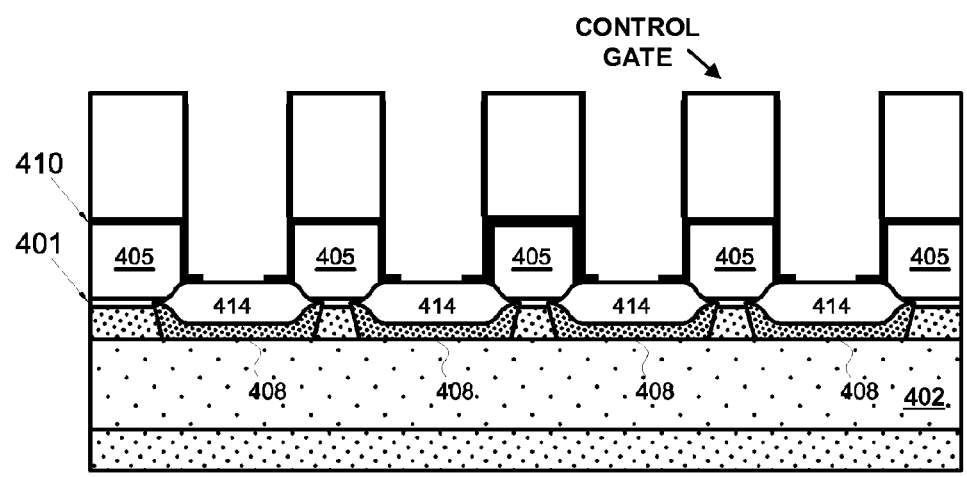

As illustrated in FIGS. 4E and 4F, a second polysilicon layer 416 can then be deposited over the inter-poly dielectric layer 410. Further known photolithographic and etching processes can then form the control gates for each cell.

Accordingly, by using the process illustrated in FIGS. 4A-4E, a virtual ground floating gate memory device can be constructed that comprises a large step height between the floating gate and the buried diffusion layer. Further, the buried diffusion oxide can encroach significantly into the diffusion regions. The combination of the increased step height and increased encroachment can provide sufficient GCR in scaled virtual ground memory cells.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method for making a memory device, comprising:
   forming a first dielectric layer on a substrate;
   forming a first polysilicon layer over the dielectric layer;

patterning and etching the first polysilicon layer to form a floating gate;

forming a buried diffusion region in the substrate after formation of the floating gate;

forming an inter-poly dielectric over the patterned first polysilicon layer and the buried diffusion region;

patterning the inter-poly dielectric to define an area for buried diffusion oxide formation;

forming a buried diffusion oxide
that is self-aligned to the floating gate and in the buried diffusion region such that the buried diffusion oxide encroaches into the buried diffusion region and extends under an edge of the first dielectric layer;

forming a second polysilicon layer directly on the inter-poly dielectric; and etching the second polysilicon layer to define a control gate for the device directly over the inter-poly dielectric and the floating gate, such that the control gate is not in contact with the floating gate.

2. The method of claim 1, further comprising forming and etching a photoresist layer to define a peripheral area, and forming a peripheral dielectric layer in the peripheral area.

3. The method of claim 2, wherein forming the peripheral dielectric layer comprises performing a thermal process to form the peripheral dielectric layer.

4. The method of claim 3, wherein the thermal process is also used to form the buried diffusion oxide.

5. The method of claim 2, wherein the peripheral dielectric layer comprises a ONO layer.

6. The method of claim 1, wherein the first polysilicon layer has a thickness in the range of approximately 1000 Å to approximately 2000 Å.

7. The method of claim 1, wherein the buried diffusion oxide has a thickness of at least approximately 200 Å.

8. The method of claim 1, wherein the height between the top of the inter-poly dielectric and the top of the buried diffusion oxide is in the range of approximately 300 Å to 800 Å.

\* \* \* \* \*